(12) United States Patent
Kim et al.

(10) Patent No.: US 6,797,575 B2
(45) Date of Patent: Sep. 28, 2004

(54) METHOD FOR FORMING A POLYCIDE STRUCTURE IN A SEMICONDUCTOR DEVICE

(75) Inventors: Young-Cheon Kim, Yongin-si (KR); In-Sun Park, Suwon-si (KR); Ju-Cheol Shin, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 91 days.

(21) Appl. No.: 10/101,209

(22) Filed: Mar. 20, 2002

(65) Prior Publication Data

US 2002/0197859 A1 Dec. 26, 2002

(30) Foreign Application Priority Data

Mar. 21, 2001 (KR) .......................................... 2001-14722

(51) Int. Cl.⁷ ............................................. H01L 21/336
(52) U.S. Cl. ........................ 438/303; 438/305; 257/381
(58) Field of Search ................................. 257/381–385, 257/412, 754; 438/303–305, 655–658, 683

(56) References Cited

U.S. PATENT DOCUMENTS

| 5,940,733 A | 8/1999 | Beinglass et al. ............ 438/655 |
| 6,404,021 B1 * | 6/2002 | Koizumi et al. ............. 257/381 |

* cited by examiner

Primary Examiner—Dung A. Le
(74) Attorney, Agent, or Firm—Lee & Sterba, P.C.

(57) ABSTRACT

A method for preventing void formation in a polycide structure includes sequentially depositing a gate oxide film, a polysilicon film doped with impurities, a seed film having a sufficient amount of silicon for reacting with an overlaying tungsten layer, a tungsten silicide precursor layer; and an etch mask made of an insulating material on a semiconductor substrate; performing a patterned etching using the etch mask; and heat-treating the resulting structure in an oxygen atmosphere at an elevated temperature and pressure to form a polycide structure wherein void formation is prevented. Since the seed film has a sufficient amount of amorphous silicon for reacting to the tungsten, migration of silicon atoms to the interfacial surface between the polysilicon film and the tungsten silicide precursor layer is prevented, thereby preventing the formation of voids in the polysilicon film.

10 Claims, 7 Drawing Sheets

METHOD FOR FORMING A POLYCIDE STRUCTURE IN A SEMICONDUCTOR DEVICE

BACKGROUND OF THE INVENTION

1. Field of the Invention

The present invention relates to a method for forming a polycide structure. More particularly, the present invention relates to a method for forming a polycide structure including tungsten silicide ($WSi_x$) in a semiconductor device.

2. Description of the Related Art

As information media, such as computers, become more widely used, a semiconductor device is required that operates at a high speed, a low voltage, and has a large storage capacitance. Accordingly, both the size of a pattern formed on a semiconductor substrate, which is fabricated as the semiconductor device, and the spacing between such patterns have become smaller.

In conventional semiconductor device fabrication, polysilicon is widely used for forming electrical wiring members, such as a gate electrode or a bit line. In order to reduce the size of and spacing between patterns, however, a lower resistant material is required for the electrical wiring members.

Recently, a polycide material has been used for forming the electrical wiring members. The polycide material has electrical features substantially identical to those of the polysilicon material except that a resistivity of the polycide material is significantly lower than a resistivity of the polysilicon material. Typically, the polycide material is deposited as a composite layer consisting of a polysilicon material doped with impurities and a refractory metal silicide material having a high melting point. The composite layer may be used as a gate electrode or a bit line of a highly integrated circuit. Preferably, the refractory metal silicide material is selected from tungsten (W), molybdenum (Mo), titanium (Ti) and tantalum (Ta).

In order to form the gate electrode or the bit line using the refractory metal silicide material, a lower pressure chemical vapor deposition process or a plasma enhanced chemical vapor deposition process is used. Among the refractory metal silicide materials, the tungsten silicide material has superior characteristics when used in a combined form with the polysilicon material. That is, when tungsten silicide is bonded to polysilicon, the resulting material has superior characteristics for self-passivation, stability against wet chemicals, surface roughness, adhesion, anti-oxidation and reproducibility. Typically, the tungsten silicide ($WSi_x$) material is obtained by reacting silane ($SiH_4$) gas with tungsten hexafluoride ($WF_6$) gas and is deposited on a semiconductor substrate by means of the chemical vapor deposition process.

FIGS. 1A to 1C illustrate sectional views showing steps of a conventional method for forming a polycide structure including tungsten silicide.

Referring to FIG. 1A, a polysilicon film 12 is formed on a semiconductor substrate 10. Polysilicon film 12 is obtained by depositing polycrystalline silicon doped with high-density impurities on the semiconductor substrate 10.

Referring to FIG. 1B, a tungsten silicide precursor layer 14 is formed on an upper surface of the polysilicon film 12 using the aforementioned silane gas and tungsten hexafluoride ($WF_6$) gas deposition process. The silane gas is supplied first in order to create a deposition atmosphere at the upper surface of polysilicon film 12. The silane gas is supplied at a flow rate of 350 to 450 sccm in a chamber having a pressure of 0.7 to 1.0 Torr and a temperature of 350 to 450° C. for 5 to 10 seconds. The $WF_6$ gas is then added at a flow rate of 3 to 4 sccm while maintaining the chamber pressure and temperature conditions described above.

Referring to FIG. 1C, a polycide pattern 18 is formed by sequentially etching the tungsten silicide precursor layer 14 and a predetermined portion of the polysilicon film 12 using a hard mask 16 made of an insulating film as an etching mask. In a final step, an oxide film 20 is formed by heat-treating the polycide pattern 18 in an oxygen atmosphere without removing hard mask 16.

In this step, oxygen gas is supplied into the chamber while the chamber temperature is maintained at 1000 to 1500° C. This heat-treating causes silicon materials contained in a patterned tungsten silicide precursor layer 14 and a patterned polysilicon film 12 to be reacted with the oxygen gas such that an oxide film 20 is formed at sidewalls of both the patterned tungsten silicide precursor layer 14 and the patterned polysilicon film 12, as well as on an upper surface of the semiconductor substrate 10. Thus, a conventional polycide structure 22 is formed.

However, when the heat-treating process is carried out under the oxygen atmosphere, if the silicon material is over-reacted to the oxygen gas, silicon contained in the patterned tungsten silicide precursor layer 14 is oxidized such that the amount of silicon contained in the patterned tungsten silicide precursor layer 14 is insufficient for being reacted with tungsten. If the amount of silicon in the patterned tungsten silicide precursor layer 14 is insufficient for reaction with tungsten, then silicon moves to the patterned tungsten silicide precursor layer 14 through an interfacial surface. This movement of silicon generates a vacancy in the patterned polysilicon film 12. In extreme conditions, a void 24 is created in the patterned polysilicon film 12, thereby causing a failure of the semiconductor device. The failure becomes more severe as the heat-treating time and the heat-treating temperature are increased and as the design rule of the polycide structure 22 is decreased.

SUMMARY OF THE INVENTION

In order to solve the foregoing problems, it is a feature of an embodiment of the present invention to provide a polycide structure made of tungsten silicide and capable of preventing void formation during a heat-treating process.

An embodiment of the present invention provides a method for creating a polycide structure including: 1) sequentially depositing: a polysilicon film doped with impurities, a seed film containing a sufficient amount of amorphous silicon for being reacted with tungsten, and a tungsten silicide precursor layer on a semiconductor substrate; and 2) converting the tungsten silicide precursor layer to tungsten silicide. Since the seed film has a sufficient amount of amorphous silicon for being reacted with tungsten, the void formation in the polysilicon film during the converting process is prevented.

The deposition of the seed film and the tungsten silicide precursor layer are preferably conducted in a common chamber at a same temperature.

These and other features of the present invention will be readily apparent to those of ordinary skill in the art upon review of the detailed description that follows.

BRIEF DESCRIPTION OF THE DRAWINGS

The above feature and advantages of the present invention will become more apparent by describing in detail preferred embodiments thereof with reference to the attached drawings in which.

DETAILED DESCRIPTION OF THE INVENTION

Korean Patent Application No. 2001-14722, filed on Mar. 21, 2001, and entitled "Method for Forming a Polycide Structure in a Semiconductor Device," is incorporated by reference herein in its entirety.

Hereinafter, a preferred embodiment of the present invention will be described in detail with reference to accompanying drawings.

FIGS. 2A to 2F illustrate sectional views showing a method for forming a polycide structure including tungsten silicide according to an embodiment of the present invention. The polycide structure described may include electrical wiring members, such as a word line, a bit line and a gate electrode. To illustrate an embodiment of the present invention, formation of a polycide structure for forming a gate electrode will be described.

Figure 1A:
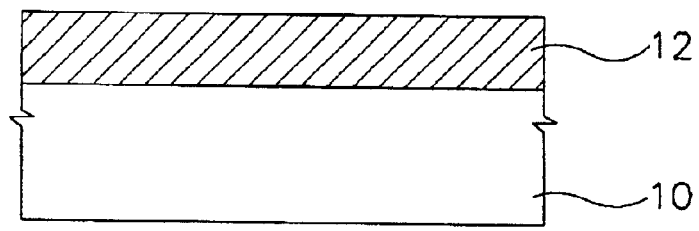
FIGS. 1A to 1C illustrate sectional views showing steps of a conventional method for forming a polycide structure made of tungsten silicide.
Figure 1B:
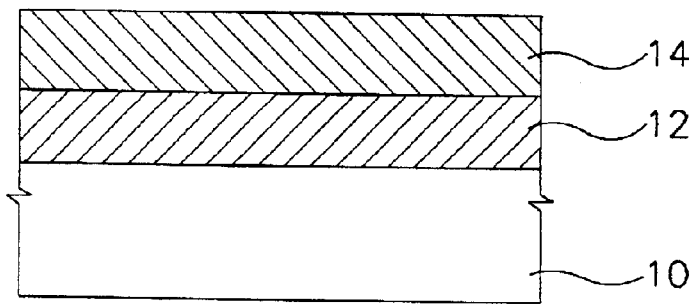
Figure 1C:
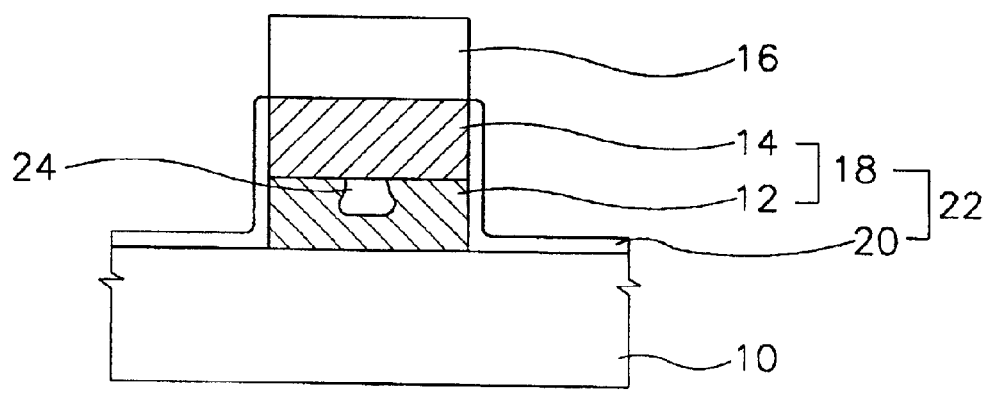
Figure 2A:
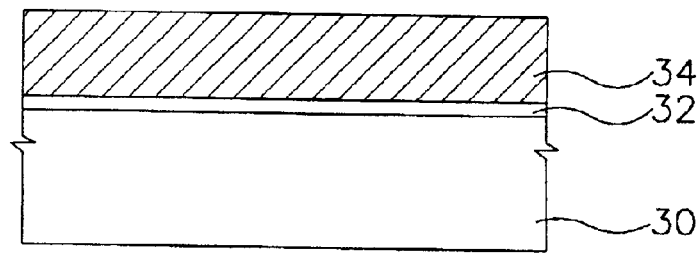
FIGS. 2A and 2F illustrate sectional views showing steps of a method for forming a polycide structure made of tungsten silicide according to an embodiment of the present invention.

Referring to FIG. 2A, a gate oxide film 32 is formed as a gate insulating film on a semiconductor substrate 30. A polysilicon film 34 doped with impurities is formed on the gate oxide film. The polysilicon film 34 is deposited to a thickness of about 500 to 1500 Å.

Figure 2B:
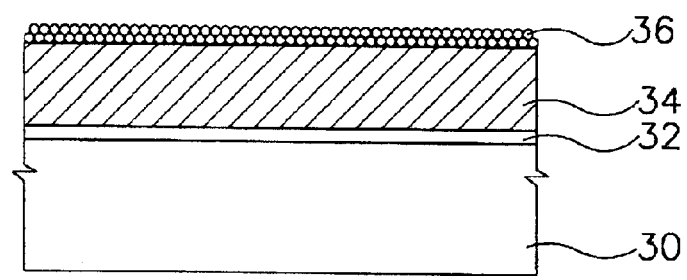

Referring to FIG. 2B, silane gas is introduced to create a deposition atmosphere and to form a seed film 36 on polysilicon film 34. Polysilicon film 34 includes a sufficient amount of amorphous silicon for reacting to tungsten. For the formation of seed film 36, the introduced amount of the silane gas is increased as compared with the amount of the silane gas during the formation of the deposition atmosphere.

If the number of silicon atoms contained in seed film 36 is insufficient for being reacted with a tungsten layer deposited in a next step, silicon atoms contained in a lower portion of the polysilicon film 34 migrate to an upper portion of the film, thereby creating a void in polysilicon film 34. Alternatively, if the number of silicon atoms contained in seed film 36 is excessive, the resistance of a resulting electrode and the processing time are increased.

In order to form seed film 36 containing an appropriate number of silicon atoms for reacting with the tungsten, an amount of the silane gas introduced is increased by five to ten times over that used for forming the deposition atmosphere. To accomplish this, the silane gas introducing time is preferably increased by five to ten times over that used for forming the deposition atmosphere in order to maintain a flow rate of the silane gas that is identical to a flow rate used in forming the deposition atmosphere. In addition, a pressure of a chamber is preferably increased by 1 to 1.5 Torr as compared with a pressure of the chamber for forming the deposition atmosphere.

Figure 2C:
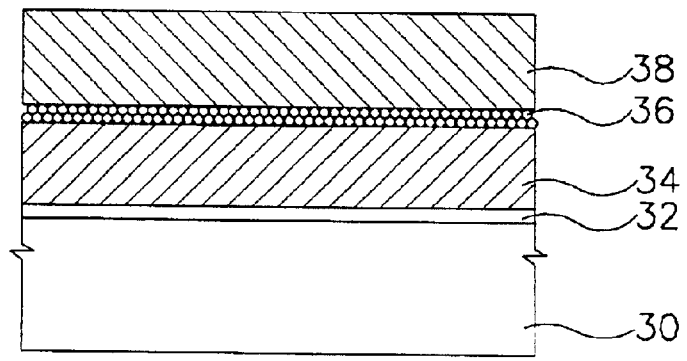

Seed film 36 is preferably formed using a chamber pressure which is no less than a chamber pressure used for depositing a tungsten silicide precursor layer 38 as shown in FIG. 2C. In other words, seed film 36 may be formed by introducing the silane gas for 60 to 90 seconds under a chamber pressure that is increased by 0.8 to 1.5 Torr as compared with a chamber pressure for depositing the tungsten silicide precursor layer 38. At this time, the flow rate of the silane gas for forming the seed film 36 is identical with the flow rate of the silane gas for depositing the tungsten silicide precursor layer 38.

If the pressure of the chamber is increased by less than 0.8 to 1.5 Torr over that used for forming tungsten silicide precursor layer 38, the silane gas introducing time is preferably increased on a proportional basis of 60 to 90 seconds for a pressure increase that is proportionally less than the desired increase of 0.8 to 1.5 Torr. Accordingly, by controlling the introducing time of the silane gas and the pressure of the chamber, the seed film 36 having the sufficient amount of silicon atoms for being reacted with the subsequent tungsten silicide precursor layer 38 may be obtained. Other conditions for forming seed film 36, except for the introducing time of the silane gas and the pressure of the chamber, are identical with the conditions for depositing the tungsten silicide precursor layer 38.

For example, the silane gas having the flow rate of about 200 to 500 sccm is introduced onto the polysilicon film 34 for about 60 to 90 seconds under the chamber pressure of about 1.5 to 1.8 Torr at the chamber temperature of about 300 to 500° C. If a pressure less than the above pressure is applied to the chamber, the silane gas introducing time is increased proportionally as discussed above. For example, if the process is carried out at a pressure of 1.0 Torr, or about a 50 to 80% reduction with respect to the 1.5 to 1.8 Torr above, the silane gas is introduced for a period of 90 to 150 seconds.

Referring to FIG. 2C, tungsten silicide precursor layer 38 is formed by supplying a mixed gas including the silane gas and $WF_6$ gas onto the seed film 36. Tungsten silicide precursor layer 38 preferably has a thickness of between about 800 to 2000 Å. In addition, a ratio of the thickness of polycide film 34 and the thickness of tungsten silicide precursor layer 38 is between about 1:1 to 1:2. The aforementioned seed film forming process and the tungsten silicide precursor layer depositing process may be carried out in the same chamber, in situ.

Figure 2D:
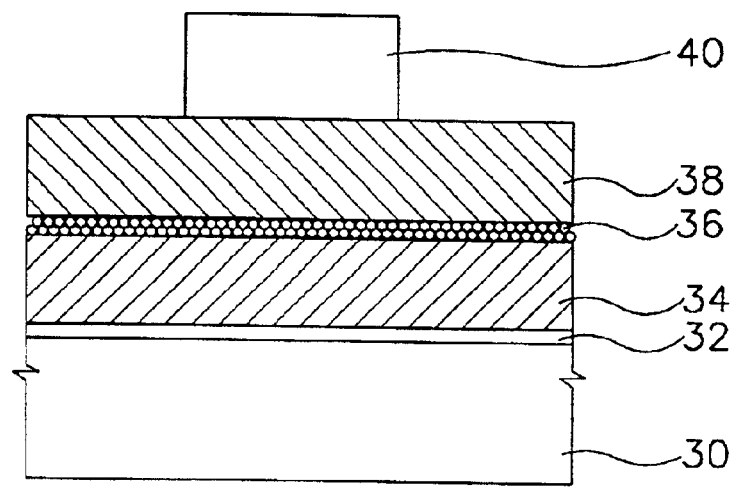

Referring to FIG. 2D, a hard mask 40 made of an insulating material is formed on an upper surface of the tungsten silicide precursor layer 38. Oxide or nitride may be used as the insulating material. In the present embodiment, a nitride film formed by depositing the nitride is described by way of an example. After forming a photoresist pattern (not shown) on a predetermined portion of the nitride film, the nitride film is etched using the photoresist pattern as an etching mask, thereby forming hard mask 40 as shown in FIG. 2D.

Figure 2E:
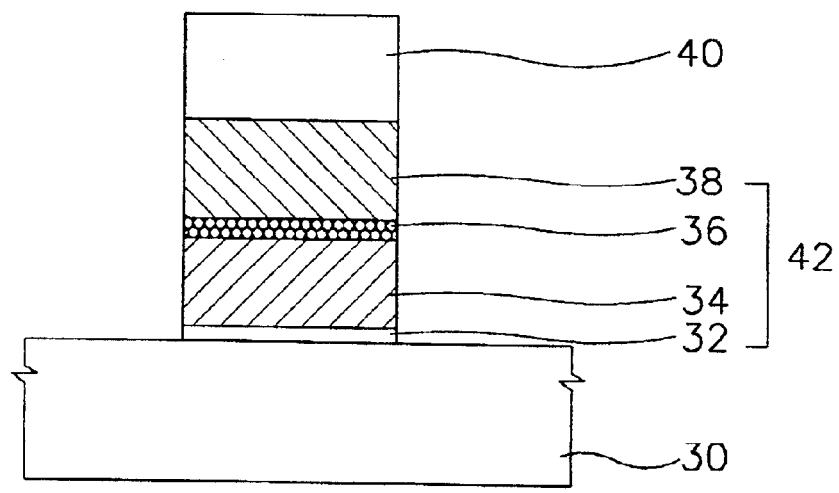

Referring to FIGS. 2D and 2E, a polycide pattern 42 is formed by sequentially etching tungsten silicide precursor layer 38, seed film 36, polysilicon film 34, and gate oxide silicon film 32. At this time, the polycide pattern 42 preferably has a line width of about 1300 to 2500 Å. In addition, the ratio of line width of the polycide pattern 42 to thickness of tungsten silicide precursor layer 38 is preferably between about 1:0.6 to 0.9.

Figure 2F:
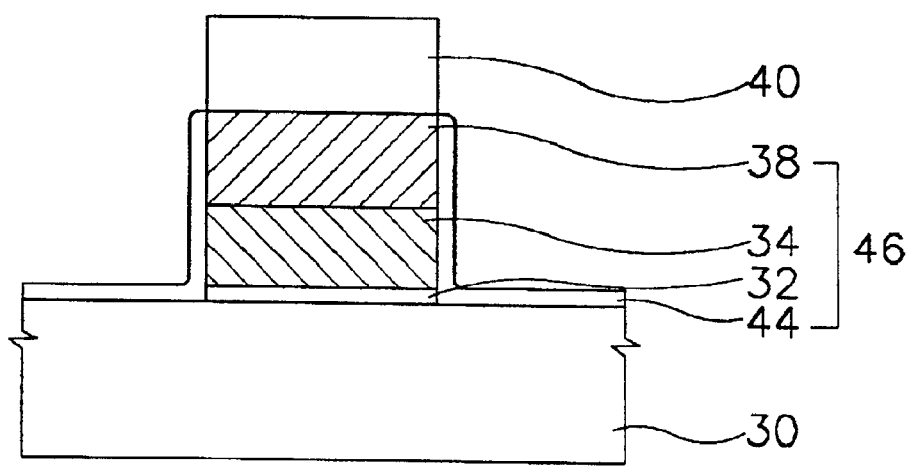

Referring to FIGS. 2E and 2F, a finished gate electrode 46 is formed by heat-treating the polycide pattern 42 shown in FIG. 2E using an oxygen atmosphere as an oxidation atmosphere. Such a heat-treating process in the oxygen atmosphere is preferably carried out without removing hard mask 40. Accordingly, an upper portion of the gate electrode 46 is not oxidized. The heat-treating process is carried out by supplying oxygen into the chamber while preferably maintaining the temperature of the chamber in a range of about 1000 to 1500° C. By performing the heat-treating process, the semiconductor substrate exposed to the gate silicon is oxidized so that an oxide film 44 is formed. Preferably, oxide film 44 has a thickness of between about 50 to 150 Å.

A sidewall of the gate electrode 46 is also oxidized during the heat-treating process. That is, silicon contained in a tungsten silicide precursor layer pattern 38 and a polysilicon film pattern 34 reacts to oxygen such that silicon oxide film 44 is formed at the sidewall of polycide pattern 42. At this time, since the silicon contained in the tungsten silicide precursor layer patter 38 is oxidized, the number of silicon atoms for reacting to the tungsten is insufficient, so the silicon atoms have to be supplied. Accordingly, the silicon atoms are supplied from the seed film 36 which was described with reference to FIG. 2B. Thus, since a sufficient number of silicon atoms for reacting to the tungsten are supplied from seed film 36, the silicon atoms in polysilicon film pattern 34 do not migrate upward and the formation of a void is prevented at the interfacial surface of polysilicon film pattern 34.

Figure 3:
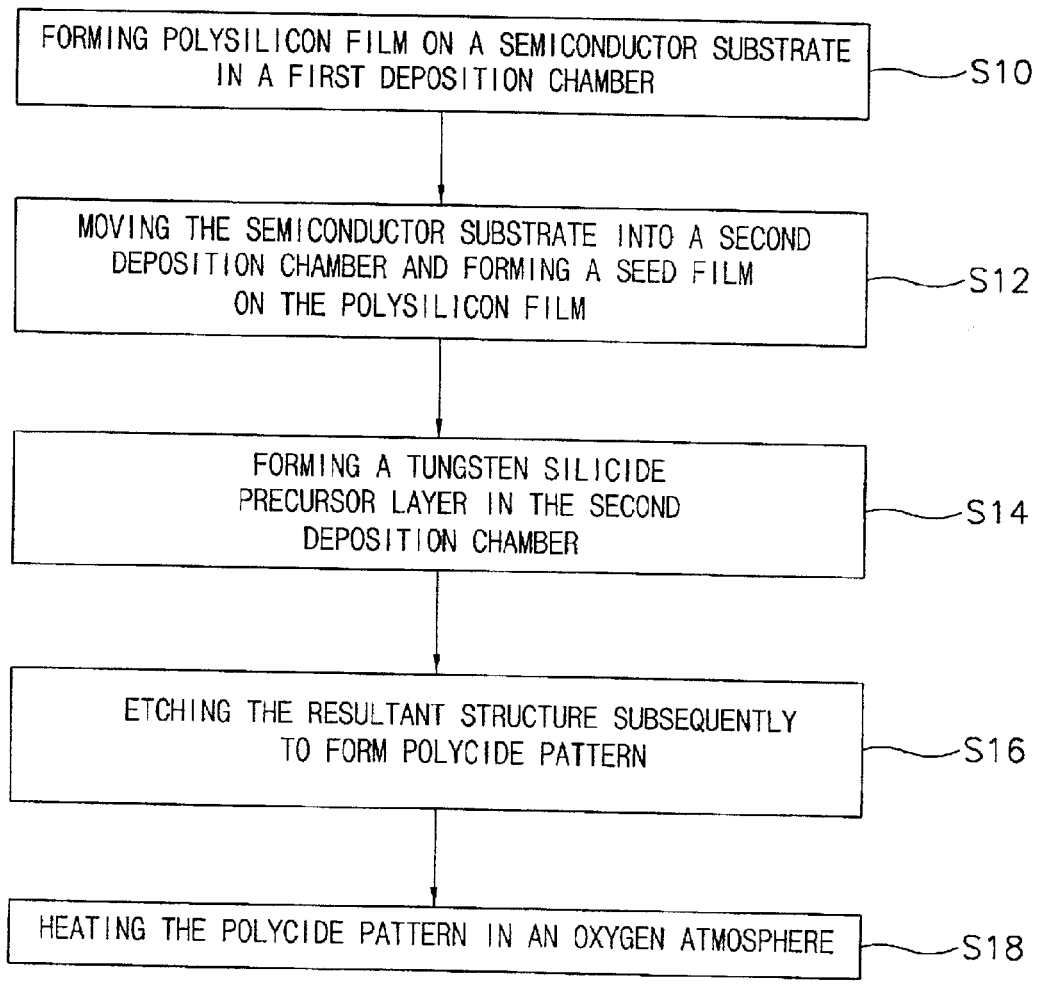
FIG. 3 is a flow chart showing steps of a method for forming a polycide structure made of tungsten silicide according to an embodiment of the present invention.

FIG. 3 is a flow chart showing steps of a method for forming the polycide structure including tungsten silicide according to an embodiment of the present invention.

In step S10, a semiconductor substrate is loaded in a first deposition chamber, and a polysilicon film doped with impurities is deposited on the semiconductor substrate. The thickness of the polysilicon film 34 is preferably between about 500 to 1500 Å.

In step S12, the semiconductor substrate formed with the polysilicon film is moved to a second deposition chamber. Silane gas is introduced into the second chamber to create a deposition atmosphere and to form a seed film, which includes a sufficient amount of amorphous silicon for being reacted with the subsequent tungsten silicide precursor layer. During the formation of the seed film, the amount of the silane gas being introduced is preferably increased by five to ten times as compared with the amount of the silane gas used for forming the deposition atmosphere.

For this purpose, the silane gas introducing time is preferably increased by five to ten times as compared with the silane gas introducing time for forming the deposition atmosphere while maintaining a flow rate of the silane gas identical with a flow rate of the silane gas for making the deposition atmosphere. In addition, the pressure in the second deposition chamber is preferably increased by one to two times as compared with a pressure of the chamber for forming the deposition atmosphere.

In step S14, a tungsten silicide precursor layer is preferably deposited by supplying a mixture of the silane gas and the $WF_6$ gas onto the seed film to a thickness of between about 800 to 2000 Å.

In step S16, a polycide pattern is formed by sequentially etching the tungsten silicide precursor layer, the seed film and a predetermined portion of the polysilicon film pattern. As previously discussed, when the etching process is carried out, the hard mask made of the insulating film is used as the etching mask, and the preferred dimensions are as discussed relative to the structure of FIG. 2E. The hard mask remains in place for a subsequent heat-treating step.

In step S18, the polycide pattern is heat-treated in an oxygen atmosphere so that the tungsten silicide precursor layer is converted to tungsten silicide, thereby forming the polycide structure.

The seed film and the tungsten silicide precursor layer are preferably sequentially formed in the second deposition chamber. Since the deposition atmosphere and the seed film are simultaneously created by introducing the silane gas into the second deposition chamber, a separate process for forming the seed film is not required. Furthermore, void formation in the polycide structure may be prevented.

To better understand the advantages of the present invention, the creation of voids caused by the deficiency of silicon in conventional tungsten silicide precursor layers will be further described.

During the heat-treating process in the oxygen atmosphere, the amount of silicon contained in the tungsten silicide precursor layer may be reduced, which leads to the formation of a void. That is, the amount of the silicon in the tungsten silicide precursor layer is reduced as the heat-treating process time and the temperature of the deposition chamber are increased. Thus, the amount of the silicon in the tungsten silicide precursor layer is reduced as the oxidized part in the tungsten silicide precursor layer pattern becomes large, thereby leading to the formation of a void.

Figure 4:
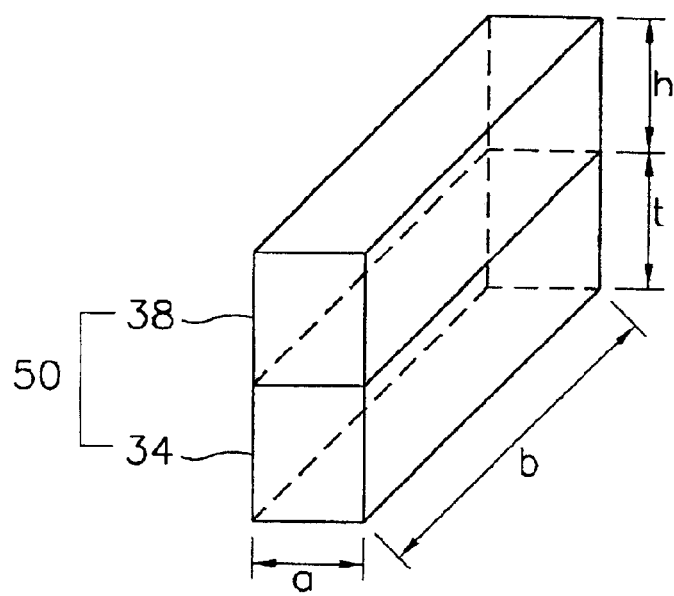
FIG. 4 illustrates a perspective view showing a deficiency of silicon in relation to a shape of the polycide structure.

FIG. 4 illustrates a perspective view showing a deficiency of silicon in relation to the shape of the polycide structure.

Referring to FIG. 4, a polycide structure 50 is formed, in which a sectional area in the length direction b and line width direction a of polycide structure 50 is oxidized. The oxidized portion of polycide structure 50 is increased or decreased along the sectional area in the length direction b of the structure.

More particularly, as the oxidized part of tungsten silicide precursor layer pattern 38 becomes large, the amount of silicon reacting to the oxygen gas increases, so the silicon deficiency increases. Occurrence of voids caused by a silicon deficiency may also increase as the surface area (a×b) of an interfacial portion between tungsten silicide precursor layer pattern 38 and polysilicon film pattern 34 is reduced, thereby reducing the number of silicon atoms available in the interfacial surface. Voids are formed because silicon atoms migrate upward from polysilicon film pattern 34 to compensate for the silicon deficiency due to the smaller interfacial surface area. Voids may also occur if the thickness h of the tungsten silicide precursor layer pattern 38 is increased while the line width a of the polycide structure 50 is decreased.

Table 1 shows a comparison of void creation as a function of the thickness h of the tungsten silicide precursor layer pattern 38 and the line width a of the polycide structure 50 when a seed film 36 is formed using conventional conditions and the conditions of the present invention.

Under the conventional conditions, which use identical conditions for the deposition process, the silane gas was supplied for 10 seconds under the chamber pressure of 0.8 Torr. Under the conditions of the present invention, the silane gas was supplied for 60 seconds under the chamber pressure of 1.8 Torr. The flow rate of the silane gas was 400 sccm and the temperature of the chamber was maintained at 400° C. for both cases.

As shown in Table 1, processes were carried out by varying the line widths a of the polycide structure 50, the thickness h of the tungsten silicide precursor layer pattern 38, and the thickness t of the polysilicon film pattern 34. Then, a seed film 36 was formed under identical conditions for creating the deposition atmosphere, the conventional polycide structure, and the polycide structure according to the present invention.

TABLE 1

| Line width | Thickness of polySi | Thickness of WSi$_x$ precursor layer | WSi$_x$/polySi | WSi$_x$/line width | Void (conventional conditions) | Void (conditions of present invention) |
|---|---|---|---|---|---|---|
| 1900 | 1000 | 1500 | 1.5 | 0.79 | Yes | No |
| 1700 | 800 | 1200 | 1.5 | 0.71 | No | No |
| 1400 | 1000 | 1000 | 1 | 0.71 | No | No |
| 1400 | 800 | 1200 | 1.5 | 0.86 | Yes | No | dimensions are in Angstroms (Å)

Referring to Table 1, voids formation is avoided in polycide film 50 when the seed film 36 is formed according to the present invention. When the seed film is formed using conventional methods, however, voids are created when the thickness of the tungsten silicide precursor is increased and the line width is narrowed. That is, when the value obtained by dividing the thickness of the WSi$_x$ precursor layer by the line width of the polycide structure is large, a void is created.

Table 2 shows a comparison of void creation as a function of the conditions for forming the seed film in the polycide structure.

The polycide structure is formed by heat-treating the polysilicon film, the seed film, and the tungsten silicide precursor layer pattern. Then, the upper portion of the polycide structure is etched to check for the presence of voids. At this time, the heat-treating process is carried out such that an oxide film having a thickness of 160 Å is formed on the semiconductor substrate.

TABLE 2

|  | Pressure (Torr) | Time (sec) | Number of voids |
|---|---|---|---|
| #1 | 0.8 | 10 | 65 |
| #2 | 0.8 | 60 | 4 |
| #3 | 0.8 | 90 | 0 |
| #4 | 0.8 | 120 | 0 |
| #5 | 1.8 | 30 | 1 |
| #6 | 1.8 | 60 | 0 |

In order to form the seed film, silane gas having a flow rate of 400 sccm is introduced in a chamber at a temperature of 400° C. The processes are then carried out by varying the silane gas introducing time and the chamber pressure. After forming the polycide structure, the tungsten silicide layer pattern is etched and the number of voids measured using a scanning electron microscope (SEM).

As shown in Table 2, when the seed film is formed under conventional conditions, which are identical to the conditions for the deposition process, that is, when the silane gas is introduced for 10 seconds under the chamber pressure of 0.8 Torr, 65 voids were observed. When the silane gas is introduced for 60 seconds under the same chamber pressure of 0.8 Torr, however, 4 voids were observed. When the silane gas is introduced for 90 seconds and 120 seconds under the same pressure condition, no voids are observed. When the silane gas is supplied for 30 seconds under an increased pressure of 1.8 Torr, only one void is detected. As the silane gas is introduced for 60 seconds under a 1.8 Torr pressure condition, no voids are observed. Thus, it may be concluded that the number of voids varies according to the conditions for depositing the seed film.

According to an embodiment of the present invention, when a polycide structure 50 having a line width of between about 1300 to 2000 Å, in which the thickness of the polysilicon film 34 is between about 500 to 1500 Å and the thickness of the tungsten silicide precursor layer 38 is between about 800 to 1500 Å, seed film 36 has a sufficient amount of silicon for being reacted with tungsten. Alternatively, seed film 36 also has a sufficient amount of silicon for reacting to the tungsten, thereby preventing the formation of voids in polycide structure 50, when the ratio of the line width of the polycide pattern 50 and the thickness of the tungsten silicide precursor layer 38 is between about 1:0.6 to 0.9.

As mentioned above, according to the present invention, a seed film 36 having the sufficient amount of silicon for being reacted with tungsten may be formed to create a polycide structure 50 without voids. Accordingly, the failure of the semiconductor device caused by void formation may also be prevented. Finally, since a seed film forming process is not separately added, but rather is simultaneously carried out with the process for creating the deposition atmosphere, the seed film forming process does not negatively influence the yield of the semiconductor device.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method for forming a polycide structure comprising:

loading a semiconductor substrate into a first deposition chamber to form a polysilicon film doped with impurities on the semiconductor substrate;

moving the semiconductor substrate formed with the polysilicon film into a second deposition chamber and introducing silane gas into the second deposition chamber to form a deposition atmosphere and to form a seed film containing an amorphous silicon for being reacted with tungsten;

supplying a mixed gas including silane gas and WF$_6$ gas into the second deposition chamber thereby depositing a tungsten silicide precursor layer on the seed film;

forming a polycide pattern by sequentially etching the tungsten silicide layer, seed film and a predetermined portion of the polysilicon film; and converting the tungsten silicide precursor layer into tungsten silicide by heat-treating the semiconductor substrate including the polycide pattern in an oxidation atmosphere.

2. A method as claimed in claim 1, wherein, when the seed film is formed in the second deposition chamber, an amount of silane gas is increased by between about five to ten times as compared with an amount of silane gas for forming the deposition atmosphere.

3. A method as claimed in claim 2, wherein, when the seed film is formed in the second deposition chamber, a silane gas introducing time is increased by between about five to ten times as compared with a silane gas introducing time for forming the deposition atmosphere while maintaining a flow rate of the silane gas identical to a flow rate of the silane gas for forming the deposition atmosphere.

4. A method as claimed in claim 2, wherein, when the silane gas is introduced for forming the seed film, a pressure of the second deposition chamber is increased by between about one to two times as compared with a pressure of the second deposition chamber for forming the deposition atmosphere.

5. A method as claimed in claim 1, wherein, when the seed film is formed, a pressure of the second deposition chamber is no less than a pressure of the second deposition chamber for forming the tungsten silicide precursor layer.

6. A method as claimed in claim 1, wherein the tungsten silicide precursor layer has a thickness of between about 800 to 2000 Å.

7. A method as claimed in claim 6, wherein the polycide pattern has a line width of between about 1300 to 2500 Å.

8. A method as claimed in claim 6, wherein a ratio of the line width of the polycide pattern and a thickness of the tungsten silicide precursor layer is between about 1:0.6 to 0.9.

9. A method as claimed in claim 1, wherein an oxide film having a thickness of between about 50 to 150 Å is formed on a surface of the semiconductor substrate by heat-treating the semiconductor substrate in the oxidation atmosphere.

10. A method as claimed in claim 1, wherein the heat-treating process in the oxidation atmosphere is carried out by supplying oxygen into the second deposition chamber while maintaining a temperature of the second deposition chamber in a range of about 1000 to 1500° C.

* * * * *